United States Patent [19]
Orgill et al.

[11] Patent Number: 5,818,273
[45] Date of Patent: Oct. 6, 1998

[54] CONFIGURABLE MULTIFUNCTION FLIP-FLOP

[75] Inventors: Rodney H. Orgill, Colorado Springs; Charles L. Cruse, Jr., Woodland Park; Kevin M. Hall, Colorado Springs, all of Colo.

[73] Assignee: Hewlett-Packard Company, Palo Alto, Calif.

[21] Appl. No.: 867,163

[22] Filed: Jun. 2, 1997

Related U.S. Application Data

[62] Division of Ser. No. 570,034, Dec. 11, 1995, Pat. No. 5,684,744.

[51] Int. Cl.$^6$ .................................................. H03K 19/177
[52] U.S. Cl. ......................... 327/199; 327/202; 327/203; 327/208
[58] Field of Search .................................... 327/199, 202, 327/203, 208

[56] References Cited

U.S. PATENT DOCUMENTS

| | | | |
|---|---|---|---|
| 4,677,318 | 6/1987 | Veenstra | 307/465 |
| 5,027,011 | 6/1991 | Steele | 307/465 |
| 5,046,035 | 9/1991 | Jigour et al. | 364/716 |
| 5,231,312 | 7/1993 | Gongwer et al. | 307/465 |
| 5,410,194 | 4/1995 | Freidin et al. | 326/46 |
| 5,440,247 | 8/1995 | Kaplinsky | 326/39 |
| 5,502,403 | 3/1996 | Liu et al. | 326/46 |
| 5,528,169 | 6/1996 | New | 326/40 |
| 5,684,744 | 11/1997 | Orgill et al. | 365/189.08 |

FOREIGN PATENT DOCUMENTS 3187519  8/1991  Japan.

*Primary Examiner*—Viet Q. Nguyen

[57] ABSTRACT

The present invention involves a configurable flip flop having a first data input node, a second data input node, and an output node. The configurable flip-flop includes an inverter coupled to the first data input node. Each of a plurality of configuration lines address a multiplexor and the flip-flop output node for selecting one of the first data input node, the second data input node, or an inverted first data input and coupling the selected one to a multiplexor output. A latch receives the multiplexor output and generates a gated output and an edge triggered output. A configuration bit controlled selector couples either the gated output or the edge triggered output to the configurable flip-flop output node.

5 Claims, 3 Drawing Sheets

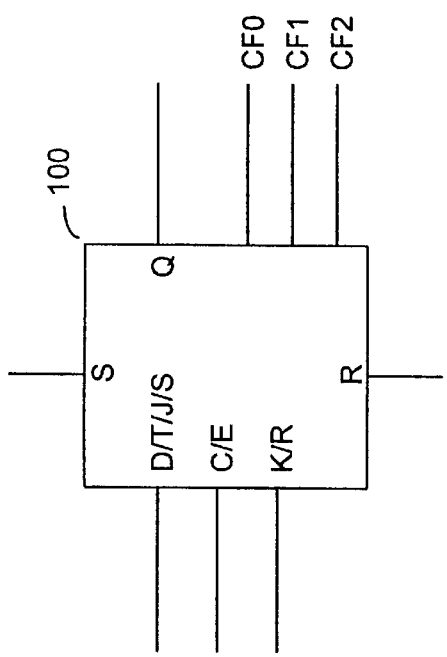

CONFIGURABLE MULTIFUNCTION FLIP-FLOP

CROSS REFERENCE TO RELATED APPLICATION

This is a divisional of application Ser. No. 08/570,034 filed on Dec. 11, 1995, now U.S. Pat. No. 5,684,744.

BACKGROUND OF THE INVENTION

1. Field of the Invention

The present invention relates, in general, to programmable logic devices, and, more particularly, to programmable logic devices having a configurable multi-function flip-flop.

2. Statement of the Problem

Programmable logic devices (PLD) are usually formed as an array of programmable elements. There may be hundreds or thousands of programmable elements that make up a single PLD integrated circuit (IC). Each of these programmable elements include circuitry for implementing one or more combinatorial functions of several inputs. From a manufacturing standpoint, it is useful to form the PLD as an array of identical elements. Hence, each programmable element is desirably generic and includes as much functionality as possible. At the same time, it is also desirable to minimize the size of each element in order to minimize the size and cost of the PLD.

The PLD is used by configuring each of the programmable elements on an IC (or on multiple ICs) to generate a desired function, and interconnecting the elements to implement complex functions. Designers often require storage elements such as flip-flops or latches to store values generated by the combinatorial portions of the circuit. Unfortunately, there are several types of flip-flops including D (Data), T (Toggle), JK, SR (Set-Reset). Further, the user may wish the flip-flop to be gated or clocked. Also, the user may wish to have a transparent flip-flop or by-pass the flip-flop altogether.

In the past, one type of flip flop was provided in each programmable element and the additional flip-flop types were implemented by programming the combinatorial logic to emulate the other types. This solution used valuable combinatorial logic to implement relatively simple functions, essentially wasting the programmable element. A need exists for an apparatus and method that allow the designer to configure the programmable element to implement the desired flip-flop type without using the combinatorial portion of the programmable element.

One prior solution is illustrated in U.S. Pat. No. 5,410,194 issued to Freidin et al. on Apr. 25, 1995. In this solution, a D-type flip-flop is provided having a D-input coupled to dedicated logic that generates the additional functionality to implement a T or JK flip-flop. A selected portion of this dedicated logic was coupled to the input of the D-type flip-flop by a programmable multiplexor. This has the advantage of freeing the programmable combinatorial logic while providing more than one type of flip-flop. However, a need remains for configurable flip flops with more functionality.

SUMMARY OF THE INVENTION

Briefly stated, the present invention involves a configurable flip flop having a first data input node, a second data input node, and an output node. The configurable flip-flop in accordance with the present invention includes an inverter coupled to the first data input node. Each of a plurality of configuration lines provide one configuration bit to the configurable flip-flop. A multiplexor is addressed by the configuration lines and the flip-flop output node for selecting one of the first data input node, the second data input node, or the inverted first data input and coupling the selected one to a multiplexor output A latch receives the multiplexor output and generates a gated output and an edge triggered output. A configuration bit controlled selector couples either the gated output or the edge triggered output to the configurable flip-flop output node.

BRIEF DESCRIPTION OF THE DRAWING

FIG. 1 shows a symbol representing a multifunction configurable flip-flop in accordance with the present invention;

FIG. 2 shows truth tables for functions that the multifunction flip-flop in accordance with the present invention can implement;

DETAILED DESCRIPTION OF THE DRAWING

1. Overview

FIG. 1 shows a symbolic representation of a configurable flip-flop in accordance with the present invention in which user selected D, T, JK, and SR edge-triggered type flip-flops are implemented as well as a transparent D latch and gated SR latch. As shown in FIG. 1, two inputs, the D/T/J/S input and the K/R input, are provided to flip-flop 100 as data inputs. Configuration inputs CF0, CF1, CF2 are provided to flip-flop 100 in order to select the configurable functions. In the preferred embodiment, flip-flop 100 provides a single output Q that implements user selected function. A clock/enable (C/E) input is provided to clock flip-flop 100 during synchronous operation or to enable flip-flop 100 in asynchronous operation. Preferably, optional global set (S) and global reset (R) inputs are also provided to flip-flop 100. Global set and reset inputs serve to asynchronously set the output queue without regard to the current state of the clock, D/T/J/S input or K/R input.

FIG. 2 illustrates a preferred set of functions or flip-flop types available in configurable flip-flop 100. The six truth tables shown in FIG. 2 represent conventional truth tables for each of the identified flip-flop types. Until now, however, these flip-flop types could not be provided in a single device with the flip-flop type selected by user input.

It should be understood that more or fewer configuration lines can be provided to flip-flop 100 in accordance with the teachings of the present invention. Likewise, an inverting as well as a non-inverting output may be provided to fit the needs of a particular application. The choice to use global set and global reset inputs increases functionality of flip-flop 100 with little additional costs, but it should be understood that they may be eliminated if desired. The set of flip-flop functions set out in FIG. 2 is exemplary only of the preferred embodiment. More or fewer flip-flop functions may be added to fit the needs of a particular application. The set of flip-flop functions identified in FIG. 2 is a rather complete set that should meet the needs of most designer.

2. Multifunction Flip-Flop Logic

Figure 3:
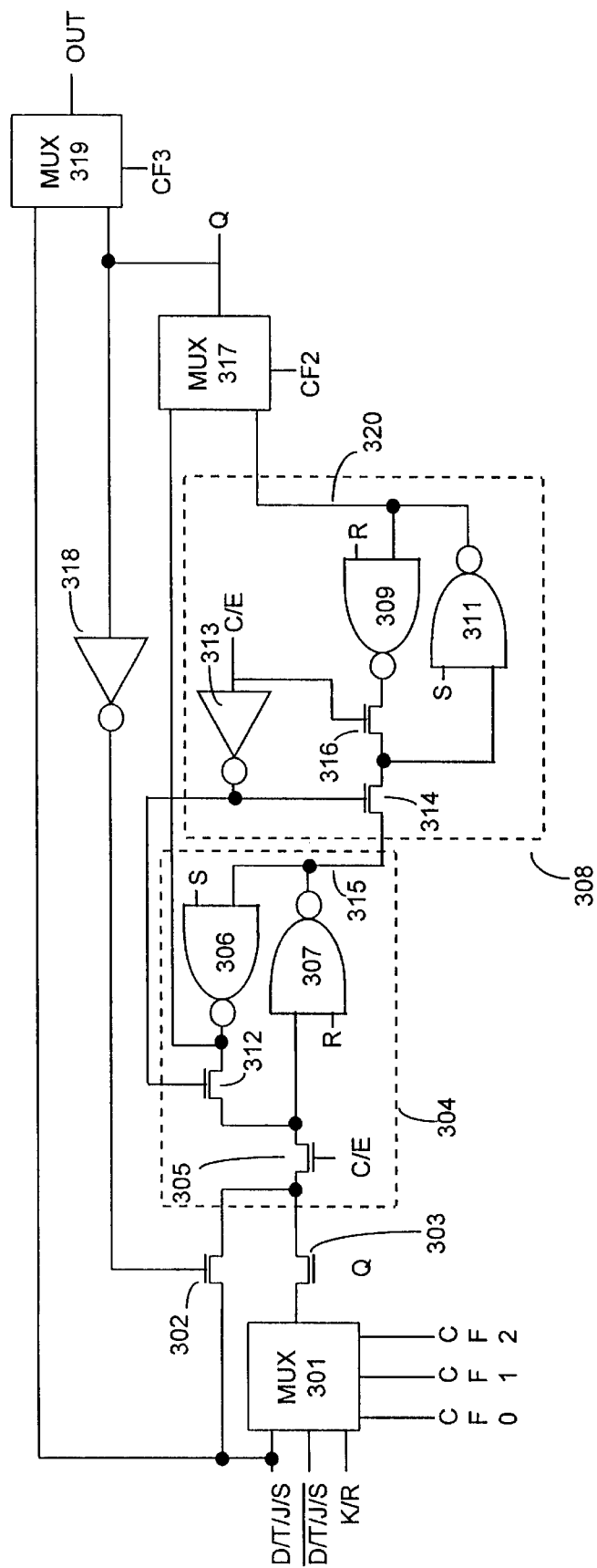
FIG. 3 illustrates a logic diagram for a preferred embodiment flip-flop in accordance with the present invention.

FIG. 3 illustrates a preferred implementation of flip-flop 100 shown in FIG. 1. In FIG. 1, the clock signal, indicated by C/E, is an active low clock which means in a resting state the clock is at a logic high level. This convention is used merely for illustration as the switches such as switches 303, 302, 314, and 316 in FIG. 3 are enhancement mode n-channel transistors which are conductive when a logic high signal is applied and non-conductive when the logic low signal is applied. It is readily understood that if p-channel or depletion mode transistors are used, the polarity of the clock signal would be changed in a predictable manner to allow configurable flip-flop 100 to function as described herein.

Latch 304 and latch 308 indicated by dashed-line boxes in FIG. 3 can be considered independent serially coupled latches, or may be considered first and second portions of a single latch. Latch 304 generates a gated output coupled to multiplexor (MUX) 317. Latch 308 generates an edge-triggered output coupled to MUX 317. MUX 317 selects between the gated or edge-triggered outputs to couple to the flip-flop output Q.

Latch 304 has an input node gated by transistor 305. Transistor 305 is controlled by the active low clock and hence is conductive whenever the clock signal is logic high (i.e., inactive) and non-conductive whenever the clock signal is low (i.e., active). Hence, data can only enter into latch 304 while C/E is logic high (i.e., no clock pulse or clock inactive).

The input node of latch 304 is coupled to a selector circuit formed by multiplexor 301 and transistors 302 and 303. The selector circuit serves to couple one and only one data input to the input node of latch 304. The data inputs to the selector circuit are the D/T/J/S line and the K/R line. In addition, one of the data lines is inverted to form a $\overline{D/T/J/S}$ line. The selector circuit is addressed by configuration bits CF0, CF1, and CF2 as well as by the Q output of flip-flop 100.

Transistors 302 and 303 form a complimentary pair where one is driven by the Q signal and one is driven by a $\overline{Q}$ signal generated by inverter 318. Transistor 302, which receives the $\overline{Q}$ signal is conductive when the flip-flop output Q is logic low. At the same time, when the Q output is low, transistor 303 is non-conductive decoupling MUX 301 from the input node of latch 304. Transistor 302 serves to bypass MUX 301 and couple the D/T/J/S line directly to the input node of latch 304 whenever the Q output of flip-flop 100 is logic low.

As can be seen by a review of the truth tables in FIG. 2, whenever Q(n) is 0 the next state Q(n+1) is equal to the input on the D/T/J/S line. On the other hand, when the Q(n) output of flip-flop 100 is a logic high the next state Q(n+1) must be selected from one of the three data lines entering MUX 301. Hence, when the Q output of flip-flop 100 is high, MUX 301 is coupled the input node of latch 304 through transistor 303, and transistor 302 is rendered non-conductive.

In operation, when the clock signal is inactive (i.e., logic high) transistor 305 is conductive and transistor 312 is non-conductive. Hence, when the clock is inactive, inverting gate 307 receives value on the input node of latch 304 and generates an inverted signal on line 315. Line 315 is coupled to the input of inverting gate 306. Inverting gate 306 produces an output that is coupled to provide the gated output to MUX 317. The output node of inverting gate 306 is also coupled through transistor 312 to the input node of inverting gate 307 to provide a feedback path when the clock is active. Hence, during a clock pulse, latch 304 has a latched output coupled to MUX 317. When there is no clock pulse, gated output 306 is a variable function depending on the input node to latch 304.

Node 315 is coupled to an input node of latch 308. Latch 308 couples data from its input node through transistor 314 to the input of inverting gate 311 only during an active clock pulse. When the clock is inactive, transistor 314 is non-conductive and transistor 316 is conductive latching latch 308 in a fixed state. Inverting gate 311 accepts in input from the input node of latch 308 during an active clock pulse and generates an output on line 320. Inverting gate 309 is coupled to the output of inverting gate 311. Inverting gate 309 is coupled through gate control transistor 316 to form a feedback path thereby allowing latch 308 to be latched when the clock is inactive. Node 320 forms the edge-triggered output coupled to MUX 317.

A configuration bit CF2 addresses MUX 317 to select between the gated output and the edge-triggered output and present the selected output on flip-flop output Q. Flip-flop output Q is coupled through inverter 318 to provide an inverted output signal Q through transistor 302. The Q output is coupled directly to the gate of transistor 303.

An optional feature shown in FIG. 3 is enabled by MUX 319 which accepts data inputs from the Q output of flip-flop 100 and a second data input coupled to one of the data lines entering flip-flop 100. In the preferred embodiment, the D/T/J/S line is coupled as a data input to MUX 319. A configuration bit CF3 controls the selection of either the Q output of flip-flop 100 or a bypass which couples the D/T/J/S line directly to the circuit output. This feature is useful in programmable logic devices where flip-flop 100 is provided at the output of each programmable logic element allowing each programmable logic element to generate an asynchronous output as well as a stored output.

3. Multiplexor Circuit

Figure 4:
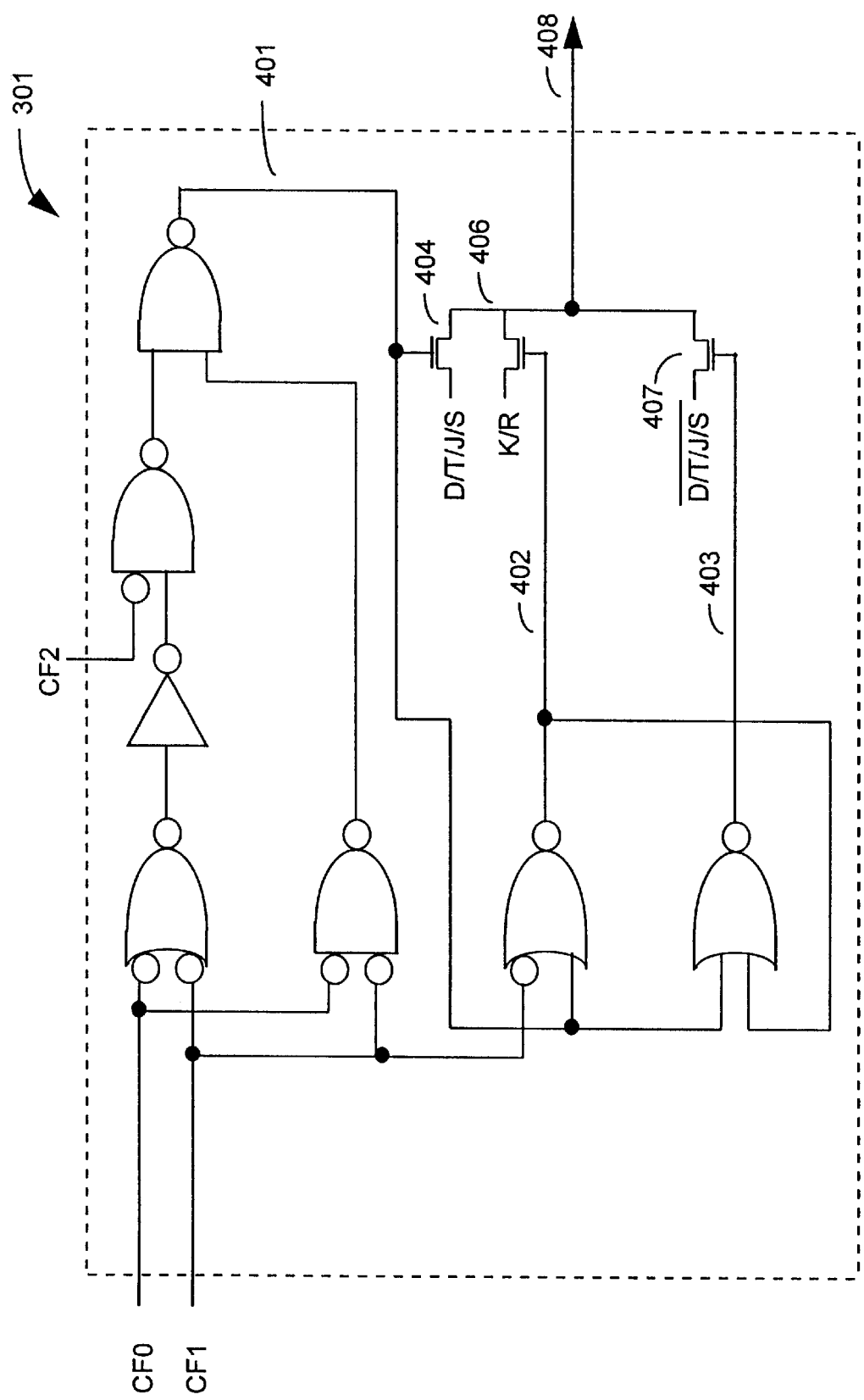
FIG. 4 shows a logic diagram of a portion of the flip-flop shown in FIG. 3.

FIG. 4 illustrates a logic diagram showing a preferred implementation of multiplexor 301 shown in FIG. 3. Multiplexor 301 serves to accept three configuration bit inputs CF0, CF1, and CF2 and generate a single output on multiplexor output line 408. The truth table for the circuitry illustrated in FIG. 4 is shown below.

TABLE 1

| CF0 | CF1 | CF2 | SEL D/T/J/S | SEL K/R | SEL $\overline{D/T/J/S}$ |
|---|---|---|---|---|---|
| 0 | 0 | 0 | 1 | 0 | 0 |
| 0 | 0 | 1 | 1 | 0 | 0 |
| 0 | 1 | 0 | 1 | 0 | 0 |
| 0 | 1 | 1 | 0 | 1 | 0 |
| 1 | 0 | 0 | 1 | 0 | 0 |
| 1 | 0 | 1 | 0 | 0 | 1 |
| 1 | 1 | 0 | 0 | 1 | 0 |
| 1 | 1 | 1 | 0 | 1 | 0 |

Line 401 forms a first select line used to select the D/T/J/S input. When select line 401 is high, the D/T/J/S line is coupled through transistor 404 to multiplexor output 408. Similarly, select line 402 selects the K/R output and couples the K/R output transistor 406 to multiplexor output line 408. Also, select line 403 couples the $\overline{D/T/J/S}$ line through transistor 407 to multiplexor output line 408. In this manner, the configuration bits are logically combined or processed to generate the three select lines 401, 402, and 403. Output line 408, as shown in FIG. 3, is coupled through transistor 303 to the input node of latch 304. Hence, one, and only one, of the input lines is coupled to the input node of latch 304.

Although particular logic implementation shown generates the desired output function, it should be understood that any combination of logic is to process configuration bits CF0–CF2 to form select lines in the manner described would be equivalent to the logic circuit shown in FIG. 4. Also, it is well known that various logic gates can be replaced by their equivalent circuits or equivalent logic gates in a different technology. The particular implementation shown in FIG. 4 uses NAND and NOR gates but other gates including OR, AND, XOR, and the like may be used. These and other equivalents are considered within the scope and spirit of the present invention.

It is to be expressly understood that the claimed invention is not to be limited to the description of the preferred embodiment but encompasses other modifications and alterations within the scope and spirit of the inventive concept.

We claim:

1. A configurable flip flop having a first data input node, a second data input node, a clock input node, and an output node, wherein the value of the output node is a function of at least one of the data input nodes, the configurable flip-flop comprising:

an inverter coupled to the first data input node and having an inverted output node;

a plurality of configuration lines, each configuration line providing one configuration bit;

a multiplexor addressed by the configuration lines and the flip-flop output node for selecting one of the first data input node, the second data input node, or the inverted first data input and coupling the selected one to a multiplexor output;

a latch coupled to receive the multiplexor output, the latch generating a gated output that is latched only when the clock is in a first state, the latch having an edge triggered output that is latched at a value equal to the value of the multiplexor output when the clock changes from the first state to the second state; and a configuration bit controlled selector for coupling either the gated output or the edge triggered output to the flip-flop output node.

2. The configurable flip-flop of claim 1 wherein the latch further comprises a global set input and a global reset input whereby a signal placed on either the global set or global reset lines forces the flip-flop output to a known state asynchronously.

3. The configurable flip-flop of claim 1 wherein the latch comprises:

a first portion having an input node receiving an input value, an inverting output node coupled to the edge triggered output, and a clock line coupled to the clock input node, said first portion having a value latched on the inverting output node when the clock is in the second state and a variable value when the clock signal is in the first state;

a second portion having an input node receiving the multiplexor output, an inverting output node coupled to the input node of the first portion, a non-inverting output node coupled to the gated output, and a clock line coupled to the clock input node, the second portion having a value latched on the inverting output node when the clock signal is in the first state.

4. A method for storing data from a first and second data line and outputting the stored data to an output line, the method comprising the steps of:

generating an inverse of the first data line;

selecting one input from the group consisting of the first data line, the second data line, or the inverse of the second data line;

coupling the selected one to a first intermediate output, wherein the first intermediate output is latched when a clock signal is in a first state;

coupling the selected one to a second intermediate output, wherein the second intermediate output is latched output when the clock signal changes from a second state to the first state;

selecting either the first intermediate output or the second intermediate output;

coupling the selected intermediate output to the output line.

5. The method of claim 4 wherein the step of selecting one input further comprises:

providing first, second, and third configuration bits;

processing the first, second, and third configuration bits to generate first, second, and third select values;

processing the value of the output line to generate a fourth select value; and selecting only one input based upon the first, second, third, and fourth select values.

* * * * *